United States Patent
Chung et al.

(10) Patent No.: US 7,847,346 B2
(45) Date of Patent: Dec. 7, 2010

(54) TRENCH MOSFET WITH TRENCH SOURCE CONTACT HAVING COPPER WIRE BONDING

(75) Inventors: Ming-Tao Chung, Kaohsiung (TW); Fu-Yuan Hsieh, Kaohsiung (TW)

(73) Assignee: Force Mos Technology Co., Ltd., Kaohsiung (TW)

( * ) Notice: Subject to any disclaimer, the term of this patent is extended or adjusted under 35 U.S.C. 154(b) by 0 days.

(21) Appl. No.: 12/292,780

(22) Filed: Nov. 26, 2008

(65) Prior Publication Data

US 2010/0127323 A1  May 27, 2010

(51) Int. Cl.
*H01L 27/108* (2006.01)
*H01L 29/76* (2006.01)

(52) U.S. Cl. .................. 257/330; 257/341; 257/343; 438/284; 438/286

(58) Field of Classification Search ............... 257/330, 257/341–343, 401, E21.41, E29.262; 438/284, 438/286
See application file for complete search history.

(56) References Cited

U.S. PATENT DOCUMENTS

| 5,629,543 A * | 5/1997 | Hshieh et al. ............... 257/330 |
| 7,629,634 B2 * | 12/2009 | Hsieh .......................... 257/288 |
| 2008/0080112 A1 * | 4/2008 | Lin et al. ........................ 361/56 |

* cited by examiner

*Primary Examiner*—Theresa T Doan
(74) *Attorney, Agent, or Firm*—Bacon & Thomas, PLLC

(57) ABSTRACT

A trench MOSFET with trench source contact structure having copper wire bonding is disclosed. By employing the proposed structure, die size can be shrunk into 30%~70% with high cell density, and the spreading resistance is significantly reduce without adding expensive thick metal layer as prior art. To further reduce fabricating cost, copper wire bonding is used with requirement of thick Al alloys.

20 Claims, 8 Drawing Sheets

TRENCH MOSFET WITH TRENCH SOURCE CONTACT HAVING COPPER WIRE BONDING

BACKGROUND OF THE INVENTION

1. Field of the Invention

This invention relates generally to the cell structure and fabrication process of power semiconductor devices. More particularly, this invention relates to a novel and improved cell structure and improved process for fabricating a trench MOSFET with trench source contact having copper wire bonding.

2. The Prior Arts

With the increasing demands of better performance, the trench MOSFET has been required to have a lower spreading resistance, smaller size and reducing fabricating cost. As shown in FIG. 1, a cell MOSFET structure of prior art (U.S. Pat. No. 6,066,877) with relatively thick metal layer is disclosed to reduce the distributed resistance of the source metal layer. Trench MOSFET 101, as illustrated, is formed on an N+ substrate 100 on which an N-doped epitaxial layer 102 is grown. Inside said epitaxial layer 102, individual transistor cells 101A-101D are formed between trench gates 102A-102E, respectively. In order to connect N+ source regions, which are formed adjacent to trench gates 102A-102E, a thin metal layer 103, typically Al, is deposited at the top surface of epitaxial layer 102. P-body regions within each cell 101A-101D, is shorted to N+ source regions also by means of said thin metal layer 103. In passivation layer 104 over thin metal layer 103, an opening 105 is formed for the deposition of thick metal layer 110. In this structure, said thick metal layer 110 consists of a Zn adhesion sublayer 110A, a thick Ni sublayer 110B, and a gold surface sublayer 110C. Au wire 107 is bonded to the top surface of metal layer 110. According to the prior art, the thick metal layer provides essentially no resistance between the transistor cells, and therefore the overall spreading resistance is dramatically reduced.

However, this "low resistance" performance is based on the sacrificial of other important characteristics. First of all, the additional Ni and Au deposition is quite expensive for the aspect of fabricating cost, and second, it is not really necessary because the additional Ni and Au deposition has a low cell density (<100M/in$^2$) with planar source contact, resulting in a huge waste of area and the corresponding increasing of spreading resistance, which counteracts the advantages by depositing the thick metal layer.

Accordingly, it would be desirable to provide a new trench MOSFET cell structure with low spreading resistance, and at the same time, with small size and low fabricating cost.

SUMMARY OF THE INVENTION

It is therefore an object of the present invention to provide new and improved trench MOSFET cell and manufacture process to reduce the spreading resistance and device area, while remaining a lower fabricating cost.

One aspect of the present invention is that, trench source contact structure is used to reduce the die size. When fabricating the trench source contact, N+ source region is formed onto P-body region, and then a trench contact is formed penetrating N+ source region to connect the source metal, N+ source region and P-body region vertically. Around the bottom of source contact trench, a P+ area is implanted to further reduce the resistance between source and body region. That is to say, comparing to the planar source contact, the trench source contact structure can save die area with a high cell density while applying a lower resistance between source and body.

Another aspect of the present invention is that, resistance between source metal and trench source contact can be further reduced by applying a larger source contact width within contact insulating layer underneath source metal. Therefore, another insulating layer is required above gate oxide layer to protect lower device from damage during etching process.

Another aspect of the present invention is that, the proposed trench source contact has vertical contact trench sidewalls within contact insulating layer (include two insulating sublayers discussed above) and N+ source regions, and has slope contact trench sidewalls within P-body region. To be detailed, the contact trench sidewalls are substantially vertical (90+/−5 degree) within contact insulating layer and N+ source regions, and the taper angle is less than 85 degree respect to top surface of epitaxial layer within P-body region to enlarge P+ area to wrap the bottom and the slope sidewalls of trench source contact to further enhance avalanche capability.

Another aspect of the present invention is that, with a high cell density (>200M/in$^2$), which achieved by using trench source contact, the die size can be shrunk into 30%~70%, causing spreading resistance significant reduced without adding the thick Ni/Au metal layer since spreading resistance is closely related to the area of fabricated device.

Another aspect of the present invention is that, to further reduce the fabricating cost, copper wire bonding will be used to replace Au wire with requirement of thick Al alloys such as AlCu or AlSiCu (larger than 3.0 μm) due to copper wire bonding will easily cause damage to device underneath the Al alloys if Al alloys is not thick enough. But copper wire bonding process requires much higher bonding force than Au wire bonding to bond the Al alloys without peeling issue.

Briefly, in a preferred embodiment, as shown in FIG. 2, the present invention disclosed a trench MOSFET cell comprising: an N+ doped substrate with a layer of Ti/Ni/Ag on the rear side serving as drain metal; a lighter N doped epitaxial layer grown on said substrate; a plurality of trenches etched into said epitaxial layer as gate trenches; a gate oxide layer, also the first insulating layer, on the front surface of epitaxial layer and along the inner surface of said gate trenches; doped poly filled within said gate trenches to form trench gates; P-body regions extending between every two trench gates; N+ source regions near the top surface of P-body regions; thick contact insulating layer, also the second insulating layer, onto front surface of epitaxial layer, which subsequently includes a sublayer of SRO (Silicon Rich Oxide) and a sublayer of BPSG or PSG; source contact trench penetrating through said contact insulating layer, said gate oxide layer and said N+ source region with vertical sidewalls while into P-body region with slope sidewalls; P+ area wrapping the slope sidewalls and bottoms of source contact trench to enhance avalanche capability; metal Ti/TiN/W or Co/TiN/W refilled into source contact trench acting as source contact metal; metal Al alloys deposited onto interconnection metal Ti or Ti/TiN to serve as source metal with a thickness equal or larger than 4 μm; at least one copper wire electrically bonded to metal Al alloys.

This invention further discloses a method for manufacturing a trench MOSFET cell comprising a step of forming said MOSFET cell with trench gates surrounded by a source region encompassed in a body region above a drain region disposed on a bottom surface of an N+ substrate. In the preferred embodiment, the method further comprises methods of forming a trench source contact and copper wire bonded to thick source metal layer.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1:
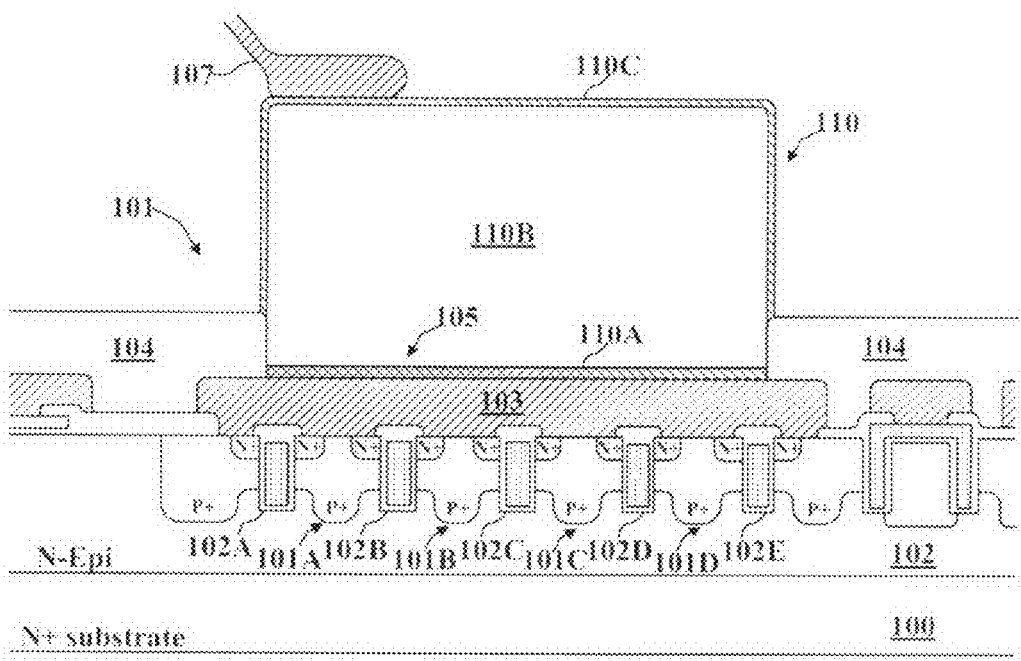
FIG. 1 is a side cross-sectional view of a trench MOSFET cell of prior art.
Figure 2:
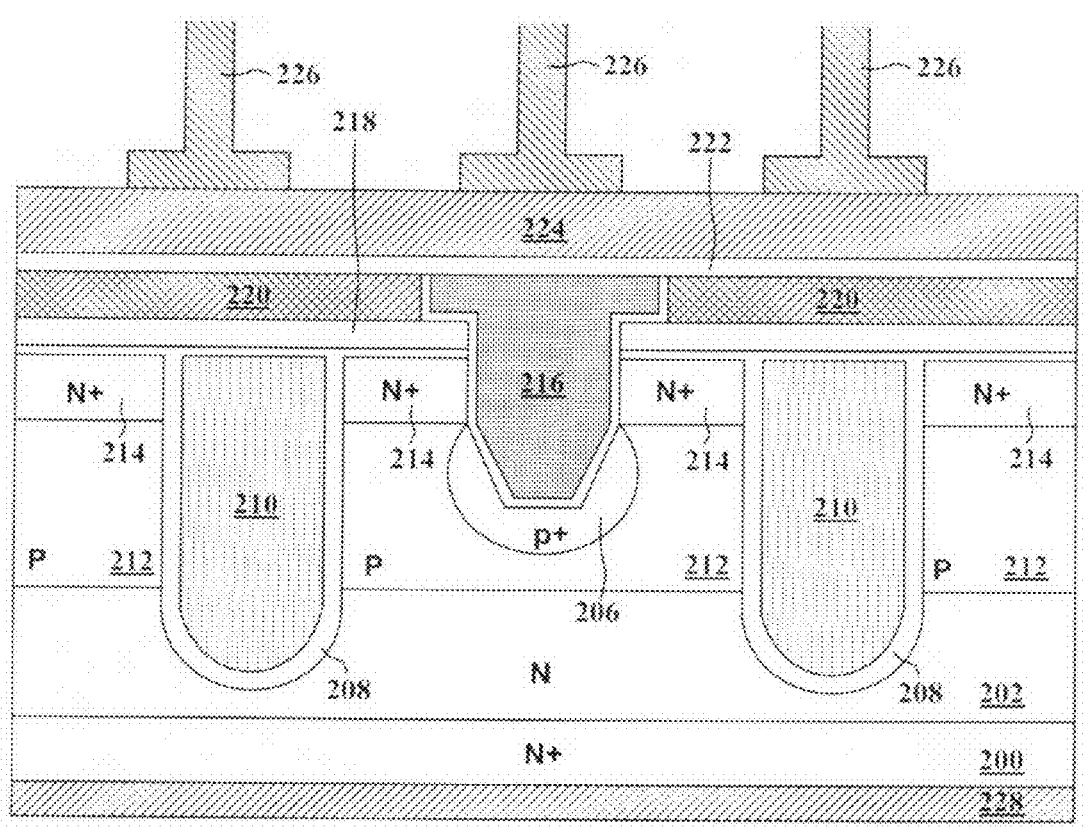
FIG. 2 is a side cross-sectional view of an embodiment for the present invention.

Please refer to FIG. 2 for a preferred embodiment of the present invention. The shown trench MOSFET cell is formed on an N+ substrate 200 coated with back metal Ti/Ni/Ag 228 on rear side as drain. Onto said substrate 200, grown an N epitaxial layer 202, and a plurality of trenches 210a (not shown) were etched wherein. To fill these trenches, doped poly was deposited into trenches 210a (not shown) above gate oxide layer 208 to form trench gates 210. P-body regions 212 are extending between trenches gates 210 with a layer of source regions 214 near the top surface of P-body regions 212. Source contact trench 216a (not shown) is etched through BPSG or PSG layer 220, SRO layer 218, N+ source region 214, and into P-body region 212. Especially, the sidewalls of source-body contact trench are perpendicular to the front surface of epitaxial layer within insulating layer and N+ source region 114 while is oblique within P-body region 212 with a taper angle less than 85 degree. Underneath trench source contact 216 filled with Ti/TiN/W or Co/TiN/W, a heavily P+ doped area 206 is formed wrapping the slope trench and bottom in P-body region 212 to reduce the resistance between source and body and thus enhance the avalanche capability. Above an interconnection layer 222, which is Ti or Ti/TiN, source metal 224 is deposited to be electrically connected to source region 214 and body region 212 via trench source contact 216. And to bond said source metal 224, at least one copper wire 226 is formed with much higher bonding force than Au wire to prevent peeling issue from happening.

Figure 3A:
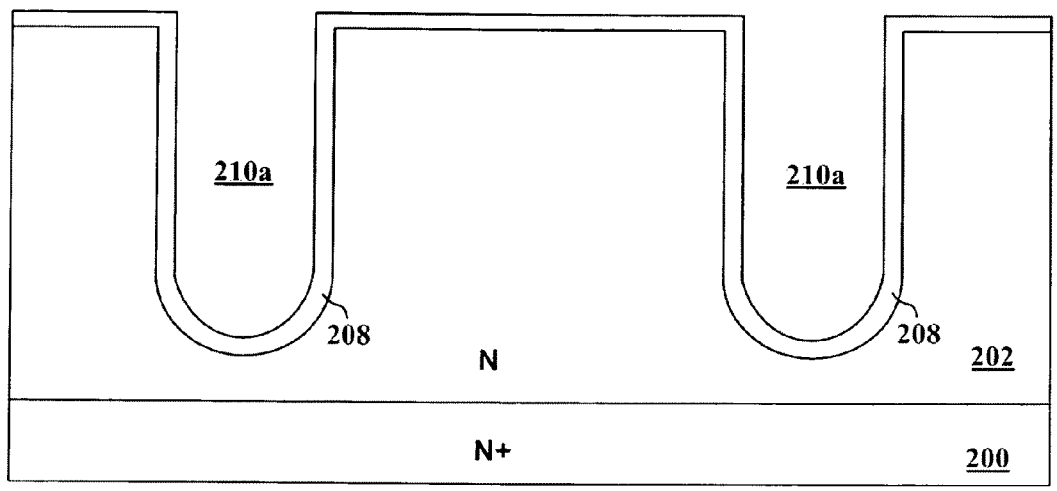
FIG. 3A to 3F are a serial of side cross sectional views for showing the processing steps for fabricating trench MOSFET cell in FIG. 2.
Figure 3B:
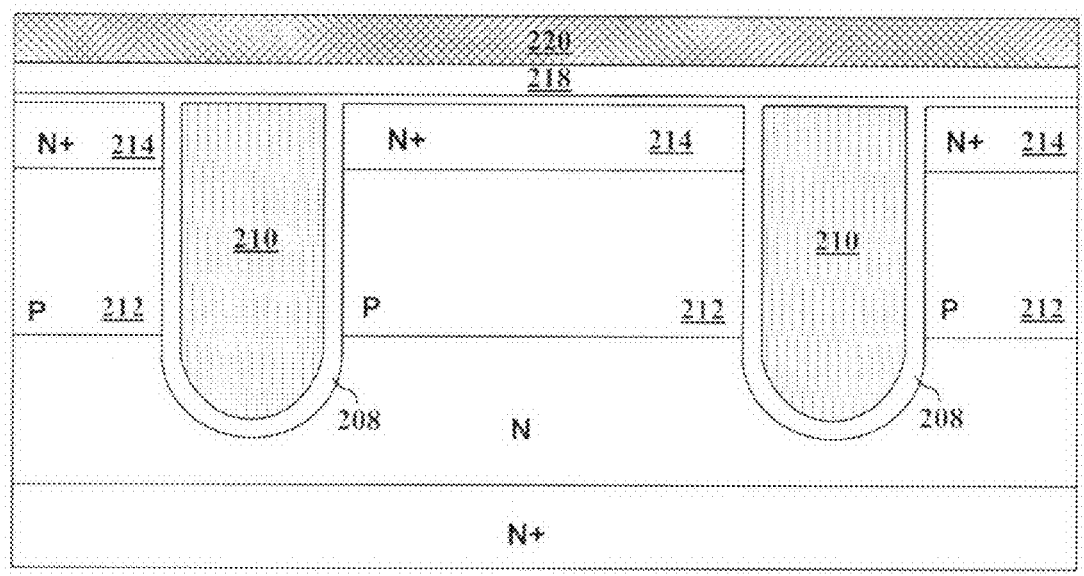

FIGS. 3A to 3F shows a series of exemplary steps that are performed to form the inventive trench MOSFET of the present invention shown in FIG. 2. In FIG. 3A, an N-doped epitaxial layer 202 is grown on an N+ substrate 200, then, a trench mask (not shown) is applied, which is then conventionally exposed and patterned to leave mask portions. The patterned mask portions define the gate trenches 210a, which are dry silicon etched through mask opening to a certain depth. A sacrificial oxide is grown and then removed to eliminate the plasma damage may introduced during trenches etching process. After the trench mask removal, a gate oxide 208, also the first insulating layer is deposited on the front surface of epitaxial layer and the inner surface of gate trenches 210a. In FIG. 3B, all gate trenches 210a are filled with doped poly to form trench gates 210. Then, the filling-in material is etched back or CMP (Chemical Mechanical Polishing) to expose the portion of gate oxide layer that extends over the surface of epitaxial layer. Next, an Ion Implantation is applied to form P-body regions 212, followed by a P-body diffusion step for P-body region drive in. After that, another Ion Implantation is applied to form N+ source regions 214, followed by an N+ diffusion step for source regions drive in. Then, the process continues with the consequent deposition of the second insulating layer, which includes SRO layer 218 and BPSG or PSG layer 220 over entire structure.

Figure 3C:
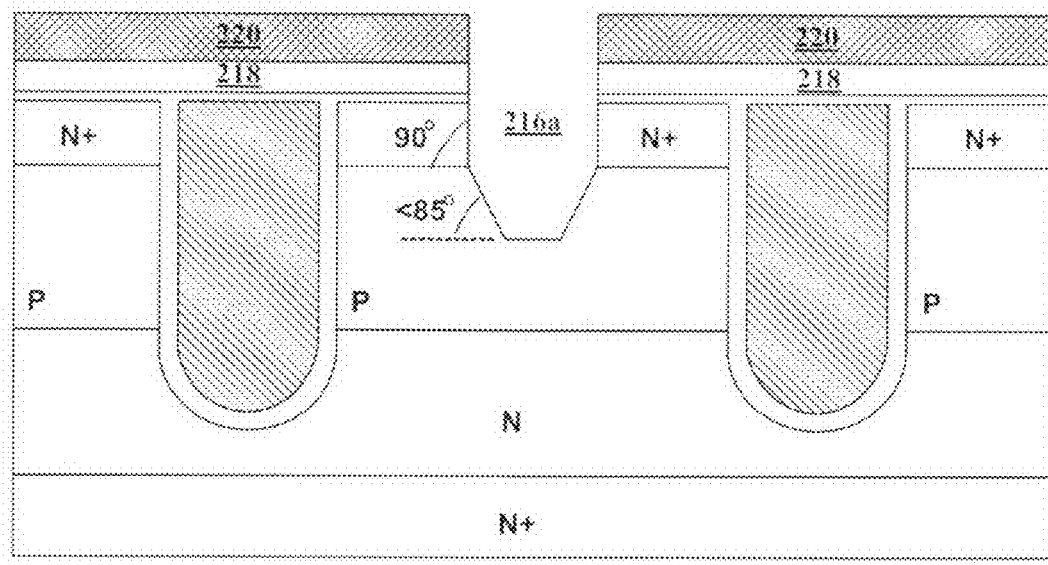
Figure 3D:
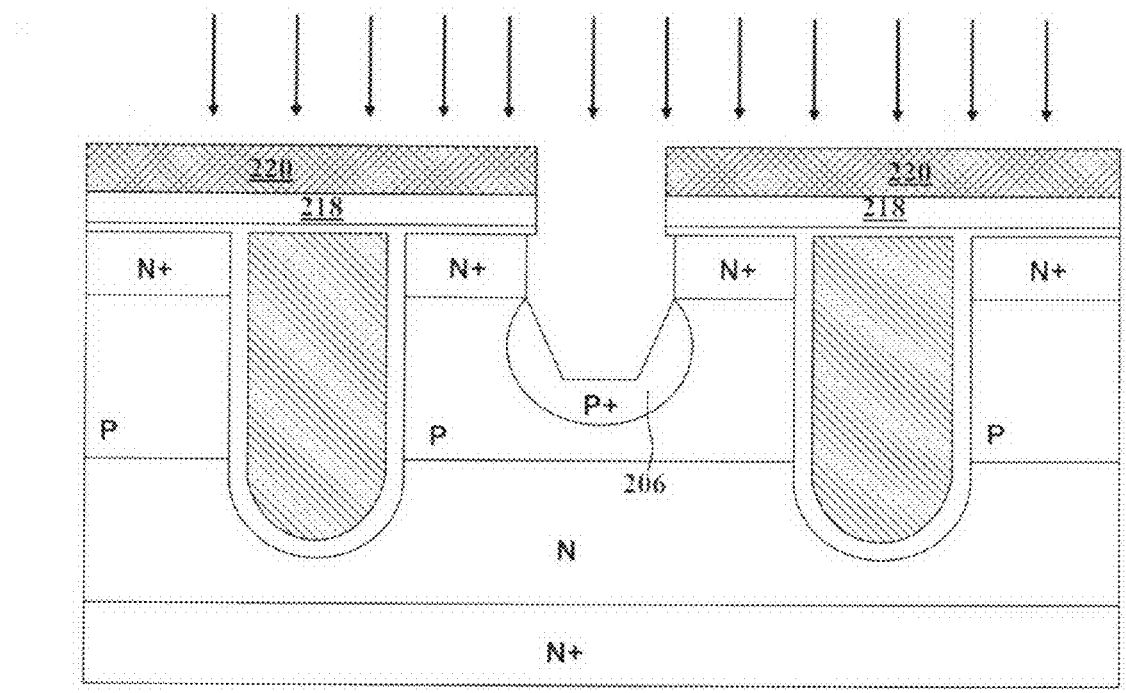
Figure 3E:
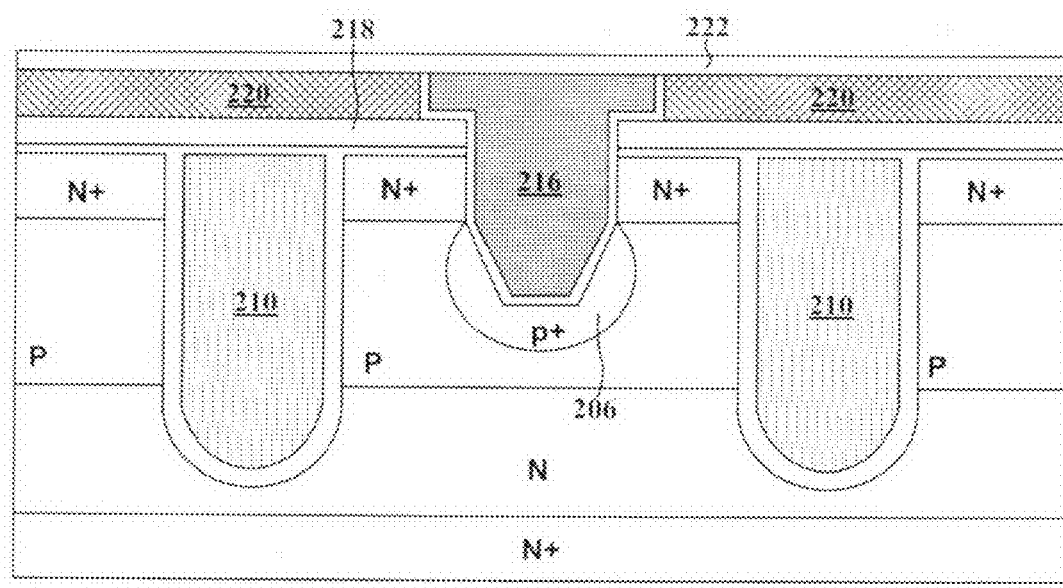
Figure 3F:
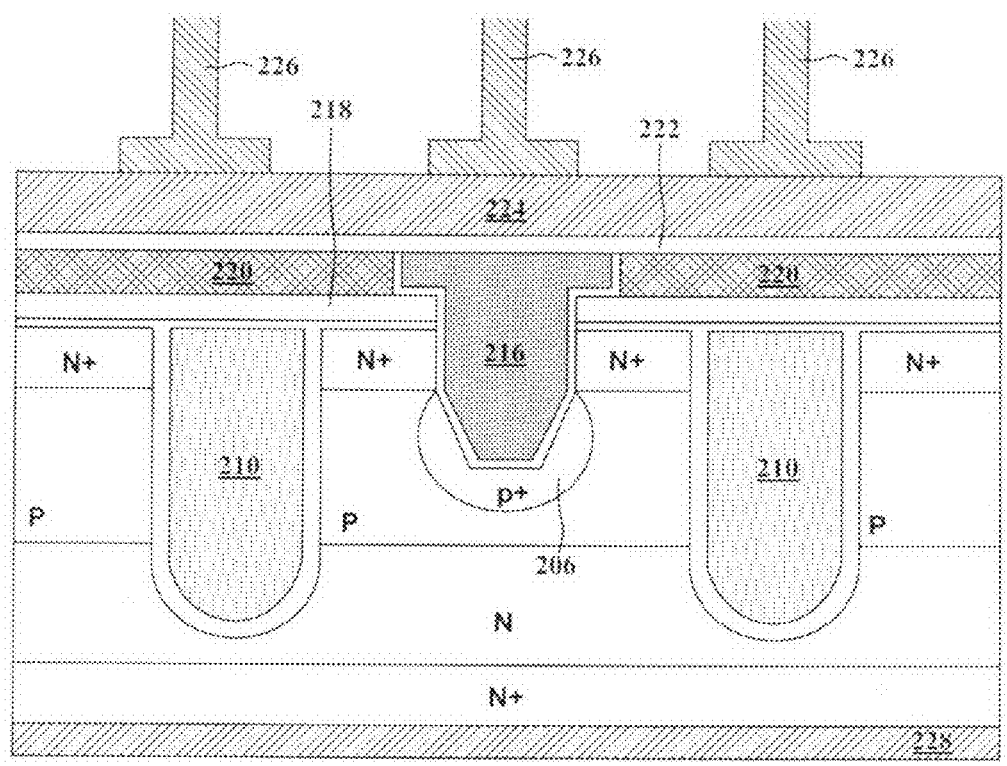

In FIG. 3C, a source-body contact mask (not shown) is applied to carry out the source contact hole in PSG or BPSG layer 220, SRO 218 and epitaxial layer by successive dry oxide etching and dry silicon etching. When etching through the second insulating layer and N+ source region, sidewalls of source-body contact trench 216a are substantially vertical (90+/−5 degree) along the N+ source region while etching into P-body regions, sidewalls of source contact trench 216a has taper angle (less than 85 degree) respect to top surface of epitaxial layer, as shown in FIG. 3C. In FIG. 3D, down stream silicon etch is employed to remove the sidewalls' damage introduced during dry silicon etch, which also creates undercut of silicon to prevent the N+ sidewalls from followed BF2 Ion Implantation for reducing source contact resistance. Then, the BF2 Ion Implantation is carried out over entire surface and into source contact trench to form the P+ area 206 wrapping the sidewalls and bottom of source contact trench within P-body region to further enhance avalanche capability. In FIG. 3E, a pre-Ti/TiN cleaning step is first performed with dilute HF to enlarge the top contact area of the source contact hole by differentially etching PSG or BPSG 220 over SRO 218 (Etch rate ratio of PSG or BPSG vs. SRO is about 10:1 in dilute HF). And then source contact trench 216a is filled with Ti/TiN/W or Co/TiN/W by a Ti/TiN/W or Co/TiN/W deposition. After that, W and Ti/TiN or Co/TiN etching back is performed to form source contact 216. Next, interconnection layer 222, typically Ti or Ti/N, is deposited onto whole device. In FIG. 3F, metal layer Al alloys are deposited on the front and rear surface of device to serve as source metal 224 and drain metal 228, respectively. Especially, the thickness of front source metal is required to be larger than 3 μm because that the followed copper wire bonding easily cause damage to device underneath Al alloys if the Al alloys is not thick enough. Last, at least one copper wire 226 is formed with high bonding force to bond source metal layer 224 without peeling issue.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A trench MOSFET comprising a plurality of semiconductor power cells with each cell comprising a plurality of trench gates surrounded by a plurality of source regions of a first type conductivity above a plurality of body regions of second type conductivity above a drain region disposed on a bottom surface of a substrate, said trench MOSFET further comprising:

a substrate of said first type conductivity;

an epitaxial layer of said first type conductivity over said substrate, having a lower doping concentration than said substrate;

a plurality of trenches extending into said epitaxial layer, surrounded by a plurality of said source regions of said first type conductivity above said body regions of said second type conductivity;
a first insulating layer lining said trenches as gate oxide;
a doped polysilicon of said first type conductivity as said trench gates overlying said first insulating layer;
a second insulating layer disposed over said epitaxial layer to isolate a source metal which contacts said both source and body regions, from said doped polysilicon as said trench gates;
a plurality of source contact trenches penetrating through said second insulating layer and said source regions with vertical sidewalls substantially perpendicular to a top epitaxial surface within said source regions, and further extending into said body regions with tapered sidewalls with respect to said top surface of said epitaxial layer;
a front metal disposed on the front surface of said trench MOSFET as said source metal;
a backside metal disposed on the backside of said substrate as a drain metal;
at least one copper wire electrically bonded to said source metal.

2. The trench MOSFET of claim 1, wherein the angle between said source contact trench sidewalls and said top surface of said epitaxial layer is 90+/−5 degrees within said source regions, and is less than 85 degrees within said body regions.

3. The trench MOSFET of claim 1, wherein said second insulating layer is a combination of SRO and PSG or BPSG to further reduce source contact resistance, and each of said source contact trenches has a wider contact width in said PSG or said BPSG than in said SRO.

4. The trench MOSFET of claim 1, wherein said source contact trenches are filled with Ti/TiN/W.

5. The trench MOSFET of claim 1, wherein said source contact trenches are filled with Co/TiN/W.

6. The trench MOSFET of claim 1, wherein said source metal is Al alloys, Ti/Ni/Ag or Cu.

7. The trench MOSFET of claim 1, wherein said source metal Al alloys have thicknesses larger than 3 um.

8. A method for manufacturing a trench MOSFET comprising a plurality of semiconductor power cells with each cell comprising a plurality of trench gates surrounded by a plurality of source regions of a first type conductivity above a plurality of body regions of second type conductivity above a drain region disposed on a bottom surface of a substrate and trench source contacts having copper wire bonding comprising the steps of:
growing an epitaxial layer upon a heavily doped first type conductivity substrate, wherein said epitaxial layer is doped with said first type conductivity dopant;
applying a trench mask to open a plurality of gate trenches into said epitaxial layer;
growing a sacrificial oxide layer onto the surface of said gate trenches to remove plasma damage introduced during opening said gate trenches;
removing said sacrificial oxide;
forming a first insulating layer on the surface of said epitaxial layer and along the inner surface of said gate trenches as a gate oxide;
depositing doped poly onto said gate oxide and into said gate trenches;
depositing a layer of Al alloys on the front and a backside metal on the rear side of said trench MOSFET, respectively.

9. The method of claim 8, wherein forming said gate trenches comprises etching said epitaxial layer according to the open areas of said trench mask by dry silicon etching.

10. The method of claim 8, wherein forming said P-body regions comprises a step of diffusion to achieve a certain depth after P-body implantation step.

11. The method of claim 8, wherein forming said source regions comprises a step of diffusion to achieve a certain depth after N+ Ion Implantation step.

12. The method of claim 8, wherein said second insulating layer is combination of SRO and PSG or BPSG.

13. The method of claim 8, wherein forming said source contact trench comprises etching through PSG or BPSG layer, SRO and gate oxide layer.

14. The method of claim 8, wherein forming said source contact trench comprises etching through said N+ source regions and into said P-body regions by dry silicon etching according to the exposed areas of said contact mask.

15. The method of claim 8, wherein implanting BF2 ion to form P+ area comprises implanting BF2 ion into source contact trench.

16. A trench MOSFET comprising:
a substrate;
a drain metal below said substrate;
an n epitaxial layer formed on said substrate;
P-body regions formed on said n epitaxial layer;
N+ source regions formed on said P-body regions;
a plurality of insulating layers formed on said N+ source regions;
a source metal formed on said insulating layers;
trench gates extending through said N+ source regions, said P-body regions and said n epitaxial layer;
a plurality of trench source contacts comprising a plurality of sidewalls, two of said sidewalls substantially perpendicular to a top surface of said source regions and two other sidewalls tapered with respect to said source regions, wherein said trench source contacts extend through said insulating layers, said N+ source regions, said P-body regions and said n epitaxial layer; and
copper wire electrically bonded to said source metal.

17. The trench MOSFET of claim 16, further comprising P+ areas wrapping said sidewalls and bottom of said trench source contacts within said P-body regions and an angle between said trench source contact sidewalls and said source region is 90+/−5 degrees within said source regions, and is less than 85 degrees within said P-body regions.

18. The trench MOSFET of claim 16, further comprising an interconnection layer between said source metal and an upper insulating layer.

19. The trench MOSFET of claim 16, wherein said source metal vertically connects to said N+ source regions and said P-body regions.

20. The trench MOSFET of claim 16, wherein said trench source contact narrows towards the P+ areas.

* * * * *